(12) United States Patent
Sherlekar et al.

(10) Patent No.: US 8,132,142 B2
(45) Date of Patent: Mar. 6, 2012

(54) VARIOUS METHODS AND APPARATUSES TO ROUTE MULTIPLE POWER RAILS TO A CELL

(75) Inventors: Deepak D. Sherlekar, Cupertino, CA (US); Gene Sluss, Cupertino, CA (US); Tushar Gheewala, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 204 days.

(21) Appl. No.: 11/734,202

(22) Filed: Apr. 11, 2007

(65) Prior Publication Data

US 2007/0180419 A1 Aug. 2, 2007

Related U.S. Application Data

(62) Division of application No. 10/779,194, filed on Feb. 13, 2004, now Pat. No. 7,219,324.

(60) Provisional application No. 60/475,248, filed on Jun. 2, 2003.

(51) Int. Cl.
*G06F 17/50* (2006.01)

(52) U.S. Cl. ......... 716/127; 716/120; 716/133; 357/534

(58) Field of Classification Search .................. 716/120, 716/121, 127; 257/204
See application file for complete search history.

(56) References Cited

U.S. PATENT DOCUMENTS

| | | | |
|---|---|---|---|
| 4,682,201 A | 7/1987 | Lipp | |
| 4,783,692 A | 11/1988 | Uratani | |
| 4,884,118 A | 11/1989 | Hui et al. | |
| 5,072,285 A | 12/1991 | Ueda et al. | |
| 5,468,977 A | 11/1995 | Machida | |
| 5,723,883 A | 3/1998 | Gheewalla | |
| 5,740,102 A | 4/1998 | Kawashima | |
| 5,742,542 A | 4/1998 | Lin et al. | |
| 5,763,907 A * | 6/1998 | Dallavalle et al. | 257/202 |
| 5,898,194 A | 4/1999 | Gheewala | |
| 5,917,228 A | 6/1999 | Matsuda et al. | |
| 5,923,059 A | 7/1999 | Gheewala | |
| 5,923,060 A | 7/1999 | Gheewala | |
| 5,981,987 A | 11/1999 | Brunolli et al. | |
| 6,091,090 A | 7/2000 | Gheewala | |
| 6,140,686 A * | 10/2000 | Mizuno et al. | 257/369 |
| 6,184,726 B1 | 2/2001 | Haeberli et al. | |
| 6,194,915 B1 * | 2/2001 | Nakayama et al. | 326/121 |
| 6,249,471 B1 | 6/2001 | Roy | |

(Continued)

OTHER PUBLICATIONS

U.S. Appl. No. 10/779,194, filed Feb. 13, 2004, Sherlekar et al.

(Continued)

*Primary Examiner* — Naum Levin
(74) *Attorney, Agent, or Firm* — Fenwick & West LLP

(57) ABSTRACT

Various methods and apparatuses are described in which an integrated circuit is organized into rows and columns of macro cells having a layout architecture that includes at least two metal layers and a plurality of traces carrying three or more different potentials of voltage routed by the metal layers. A first, a second, and a third adjacent metal layers extend across the integrated circuit. The plurality of traces carry three or more different potentials of voltage and are routed in the metal layers. A first power trace supplies a VDD voltage potential. A second power trace supplies a VSS voltage potential. A third power trace supplies a third voltage potential to support sleep modes and retain data during sleep modes. All three power supply traces connect to one or more transistors in a first macro cell.

20 Claims, 6 Drawing Sheets

U.S. PATENT DOCUMENTS

| | | | |
|---|---|---|---|
| 6,306,744 B1 | 10/2001 | Aldrich | |
| 6,307,272 B1 | 10/2001 | Takahashi et al. | |
| 6,308,307 B1 * | 10/2001 | Cano et al. | 257/207 |
| 6,337,593 B1 * | 1/2002 | Mizuno et al. | 327/534 |
| 6,340,825 B1 | 1/2002 | Shibata et al. | |
| 6,380,798 B1 * | 4/2002 | Mizuno et al. | 327/534 |
| 6,445,065 B1 | 9/2002 | Gheewala et al. | |
| 6,448,631 B2 | 9/2002 | Gandhi et al. | |
| 6,462,978 B2 | 10/2002 | Shibata et al. | |
| 6,538,945 B2 | 3/2003 | Takemura et al. | |
| 6,609,236 B2 * | 8/2003 | Watanabe et al. | 716/119 |
| 6,611,943 B2 * | 8/2003 | Shibata et al. | 716/102 |
| 6,617,621 B1 | 9/2003 | Gheewala et al. | |
| 6,683,767 B2 * | 1/2004 | Ito et al. | 361/56 |
| 6,838,713 B1 | 1/2005 | Gheewala et al. | |
| 6,842,375 B1 | 1/2005 | Raszka | |
| 6,912,697 B2 | 6/2005 | Shibata et al. | |
| 6,938,225 B2 | 8/2005 | Kundu | |
| 6,941,258 B2 | 9/2005 | Heijningen et al. | |
| 6,998,722 B2 * | 2/2006 | Madurawe | 257/66 |
| 7,002,397 B2 * | 2/2006 | Kubo et al. | 327/534 |
| 7,002,827 B1 | 2/2006 | Sabharwal et al. | |
| 7,069,522 B1 * | 6/2006 | Sluss et al. | 716/114 |
| 7,073,147 B2 * | 7/2006 | Ikeda et al. | 716/120 |
| 7,129,562 B1 | 10/2006 | Gheewala et al. | |
| 2002/0189910 A1 | 12/2002 | Yano et al. | |
| 2003/0009730 A1 | 1/2003 | Sherlekar et al. | |
| 2003/0102904 A1 | 6/2003 | Mizuno et al. | |
| 2006/0198228 A1 * | 9/2006 | Sluss et al. | 365/229 |

OTHER PUBLICATIONS

Victor V. Zyukan et al., Low Power Integrated Scan-Retention Mechanism, (OBM), ISPLED 2002, Aug. 12-14, 2002, pp. 1-18.

Virage Logic, "Speed Power, ASAP Standard Cell Libraries", Copyright 2002 Virage Logic Corporation, pp. 4 total.

Non-Final Office Action for U.S. Appl. No. 10/779,194 mailed Apr. 5, 2006, 9 pages.

Non-Final Office Action for U.S. Appl. No. 10/779,194 mailed Sep. 13, 2006, 5 pages.

Non-Final Office Action for U.S. Appl. No. 10/856,520 mailed May 23, 2005, 3 pages.

Non-Final Office Action for U.S. Appl. No. 10/856,520 mailed Aug. 8, 2005, 4 pages.

Non-Final Office Action for U.S. Appl. No. 10/856,520 mailed Oct. 26, 2005, 9 pages.

Ex Parte Quayle Office Action for U.S. Appl. No. 10/856,520 mailed Jan. 10, 2006, 5 pages.

Non-Final Office Action for U.S. Appl. No. 11/401,806 mailed Jul. 24, 2008, 5 pages.

Non-Final Office Action for U.S. Appl. No. 11/401,806 mailed Oct. 21, 2008, 9 pages.

Knapp, K., "Proper Planning Assures SoC Power Integrity—At 90nm and Below, Avoiding IR Drop and Electromigration Problems Becomes a Crucial Aspect of SoC Design," Dec. 2006/Jan. 2007 Issue of Chip Design Magazine, Internet download http://www.chipdesignmag.com/print,php?articleID=966?issueID=20, Apr. 27, 2007, 6 pages.

* cited by examiner

VARIOUS METHODS AND APPARATUSES TO ROUTE MULTIPLE POWER RAILS TO A CELL

RELATED APPLICATIONS

This application is a Divisional Application which claims benefit including priority to U.S. application Ser. No. 10/779,194, filed on Feb. 13, 2004, titled 'Various methods and apparatuses to route multiple power rails to a cell', which is now U.S. Pat. No. 7,219,324 and which claims the benefit of U.S. Provisional Application No. 60/475,248, that was filed on Jun. 2, 2003, and is titled "Low power memory design."

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to the field of routing connections in cell-based integrated circuits and gate array based integrated circuits. More particularly, an aspect of an embodiment of the invention relates to an improved power and signal routing architecture and technique to for high density and low power cell design.

BACKGROUND OF THE INVENTION

Gate array technology as well as cell-based or standard cell design, have been developed as a method of quickly designing integrated circuits.

Gate array technology is characterized by patterns of regularly placed transistors. The transistors are arranged in patterns known as basic cells. Basic cells are the smallest building block of the technology and are configured to facilitate creation of dense macro cells and efficient signal routing. Typically, the basic cells are placed on the integrated circuit in an array pattern with rows and columns. This array pattern is called a gate array.

Basic cells are combined into pre-designed circuit units known as "macro cells." Macro cells are commonly used elements such as NAND gates, NOR gates, and flip-flops. A designer, with a tool such as a compiler, selects desired elements from a library of macro cells and places them in a design. The macro cells may be interconnected in a variety of ways to perform desired functions. By being able to select macro cells from a library and place them into a design, a designer can quickly design complex functions without having to worry about the details of each individual transistor. Typically, a library of macro cells are designed from basic cells for a certain technology, and their design characteristics do not change from one design to the next.

In cell based or standard cell integrated circuits, the transistors used to construct macro cells are custom built for each macro cell, rather than from the underlying array of basic cells. However, all macro cells have the same height, and are arranged in rows similar to gate arrays.

Because a designer will use many macro cells in a particular design, it is important that the macro cells be designed as efficiently as possible. Otherwise, the inefficiencies will be multiplied, since they are replicated with every instance of the macro cell in the design.

As described above, the macro cells are made up of interconnected transistors that either belong to the underlying basic cells, or are custom crafted for the macro cell. Local interconnections are used to interconnect the transistors to form macro cells. Global interconnections are used to route signals from the input/output terminals of a macro cell to the input/output terminals of other macro cells. Clock signals, reset signals, power signals, and test signals are other examples of signals that may be routed by global interconnections. It is important that the macro cells be designed such that local and global interconnections can be made efficiently.

One concern of gate array and standard cell based designers is routing VDD and VSS (GROUND) power supply traces to the transistors of the basic cells efficiently. FIG. 1 shows a prior art design taught, for example, in U.S. Pat. Nos. 5,072,285, 4,682,201, 4,884,118, 4,783,692, and others, to route power supply traces to basic cells in a gate array.

FIG. 1 illustrates a block diagram portion of one row of a gate array design with two basic cells. Each basic cell 101 comprises a p-type diffusion region 105 and an n-type diffusion region 107. Two gate regions 113 extend across p-type diffusion region 105 forming a pair of PMOS transistors and two gate regions 115 extend across n-type diffusion region 107, forming a pair of NMOS transistors.

Several basic cells 101 are arranged in rows and columns on a substrate forming an array of basic cells 101. Power supply trace 130 extends across rows of basic cells 101 in the metal one (M1) layer above p-type diffusion region 105. Typically, power supply trace 130 is coupled to a VDD power supply source (not shown). Similarly, power supply trace 132 is formed on the M1 layer above n-type diffusion region 107, and is typically coupled to a GROUND (VSS) power supply source (not shown). Power supply traces 130 and 132 extend across rows of the array.

Most commonly, power supply traces 130 and 132 are connected to diffusion region 105 and 107 at a common node between the two transistors by contacts 140 and 142. An advantage of this layout is that a direct connection can be made between power supply traces 130 and 132 and diffusion regions 105 and 107, without additional metal routing.

Traditionally, as shown in the basic cell illustrated in FIG. 1, the M1 layer has been used to route power supply traces and other global interconnections in the direction parallel the rows (horizontal). Second layer metal (M2) has been used for global signal interconnections in the direction parallel the columns (vertical), and third layer metal (M3) for routing global signal interconnections in the direction parallel the rows (horizontal).

A disadvantage of this architectural layout is that power supply traces 130 and 132 are routed on the M1 layer. This restricts the number of local interconnections that can be made on the M1 layer, thus requiring an increased use of the M2 layer to cross over power supply traces 130 and 132. For example, in FIG. 1, local interconnection 140 is located on the M2 layer in order to cross over power supply traces 130 and 132. Having local interconnections on the M2 layer causes significant blockage for M2 layer global routing, and hence lower gate density.

In CMOS cell based and gate-array integrated circuits, providing multiple supplies of different voltage potential may be needed for biasing the substrate and/or Nwell potential separately from the device source potential(s). Macro cells requiring different voltage supply potentials may be need to be intermingled, by routing on the first metal routing layer multiple supplies carrying distinctly different voltage potentials within each cell boundary. However, this method consumes lots of area on a chip since 1) the power supply wiring, 2) the cell connection and 3) the signaling wiring all use the same routing layer. Further, the routing of the above three power supply lines entirely in the first metal layer causes cell wiring to be excluded from the regions of the cell where those power supply wiring are routed. The cell wiring is excluded from the regions of the cell regardless of whether or not that voltage supply wiring is used by the specific macro cell because the power traces on the M1 layer extend into the macro cell and occupy area that would have been available for cell and signaling routing.

SUMMARY OF THE INVENTION

Various methods and apparatuses are described in which an integrated circuit is organized into rows and columns of macro cells having a layout architecture that includes at least two metal layers and a plurality of traces carrying three or more different potentials of voltage routed by the metal layers. The plurality of traces carry three or more different potentials of voltage and are routed in the metal layers. A first power trace supplies a VDD voltage potential. A second power trace supplies a VSS voltage potential. A third power trace supplies a third voltage potential to support sleep modes and retain data during sleep modes. All three power supply traces connect to one or more transistors in a first macro cell.

BRIEF DESCRIPTION OF THE DRAWINGS

The drawings refer to embodiments of the invention in which:

FIG. 2b illustrates an example schematic diagram of an embodiment of the transistors in the macro cell illustrated in FIG. 2a.

FIG. 2c illustrates a logic symbol corresponding to the macro cell illustrated in FIG. 2a;

Figure 1:
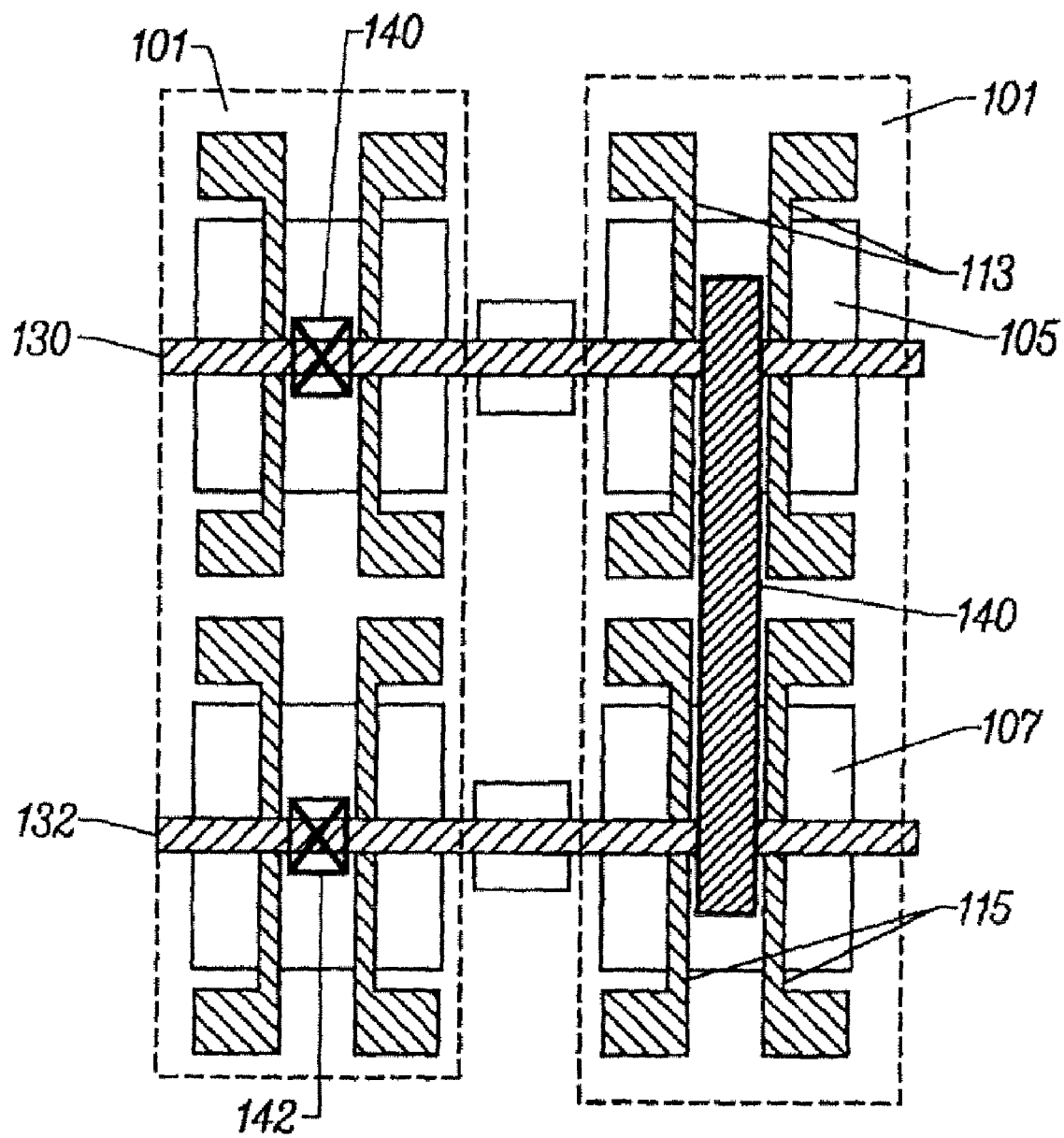
FIG. 1 illustrates a block diagram portion of one row of a gate array design with two basic cells.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of transistors, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first transistor, may be made. However, the specific numeric reference should not be interpreted as a literal sequential order but rather interpreted that the first transistor is different than a second transistor. An example 2 input NAND gate will be used as an example macro cell formed and connected with the various power and signaling traces. However, this is only for illustration purposes, as many other logic gates can be formed. The NAND illustrates how the power and signaling traces may be routed and connected to a macro cell. Thus, the specific details and implementations set forth are merely exemplary. The specific details and implementations may be varied from and still be contemplated to be within the spirit and scope of the present invention.

In general, various methods and apparatuses are described in which an integrated circuit is organized into rows of macro cells having a layout architecture that includes at least two metal layers and a plurality of traces carrying three or more different potentials of voltage routed by the metal layers. Three or more adjacent metal layers extend across the integrated circuit. The metal layers are stack on top of each other with insulating layers in between. The first metal layer may be located between the second metal layer and the layers of transistors in the macro cells. The second metal layer may be located between the third metal layer and the first metal layer. The third metal layer may be orientated orthogonal to the second metal layer.

The plurality of traces carry three or more different potentials of voltage and are routed in the metal layers. A first power trace supplies a VDD voltage potential. A second power trace supplies a VSS voltage potential. A third power trace supplies a third voltage potential. A fourth power trace supplies a fourth voltage potential and so on. All of the power supply traces may connect to one or more transistors in a particular macro cell.

The third voltage potential may, for example, 1) bias the well substrate of a transistor higher than the source voltage potential on that transistor to reduce power loss due to leakage, 2) enhance performance time of transistors in that macro cell, 3) provide a constant source of power to components in the macro cell when the primary source supplies, VDD/VSS, are turned off, 4) provide a switchable on/off source of power to components in the macro cell when the integrated circuit is in operation, 5) connect to some of the macro cells in a row of macro cells to allow adjacent macro cells to operate with different voltage potential requirements and different amounts of voltage supplies then a neighboring adjacent macro cell, 6) provide other similar functions.

Figure 2A:
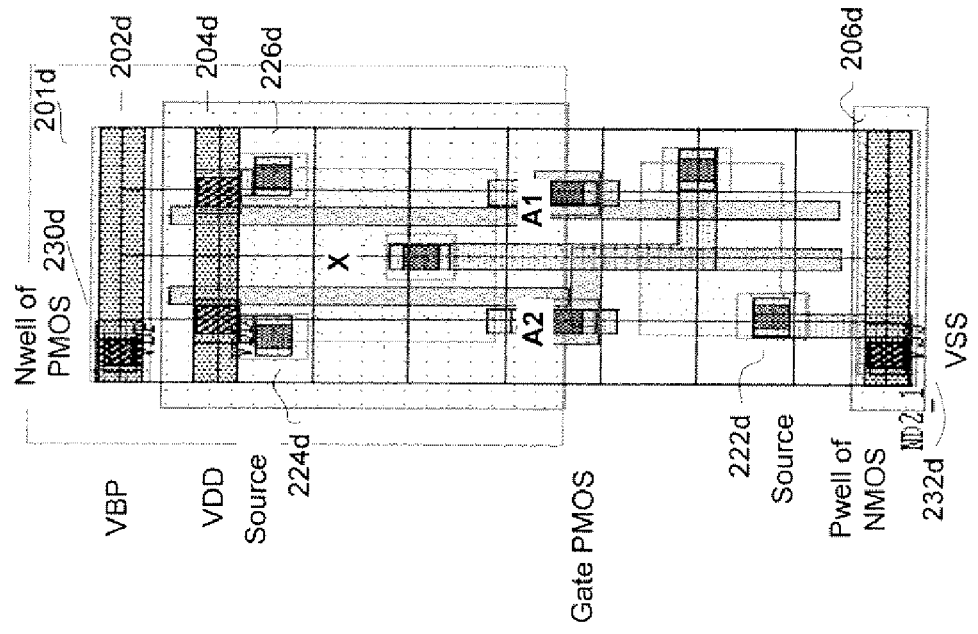
FIG. 2a illustrates an embodiment of a macro cell implementing a 2 input NAND function connecting to four power supply traces.

FIG. 2a illustrates a block diagram an embodiment of transistors in a macro cell connecting to four power supply traces. The integrated circuit may organized in rows and columns of macro cells with multiple layers of metal such as a first, a second, a third, and a fourth metal layers residing above the macro cells. Each layer of metal is separated from the other by an insulating layer. The first metal layer M1 is nearest the substrate, the second metal layer M2 is above the first metal layer, and the third metal layer M3 is above the second metal layer and is the farthest layer from the substrate. If desired, additional metal layers may also be used.

The second metal layer is above the first metal layer and has a plurality of conductive traces carrying power across the rows. The first metal layer has a plurality of conductive traces that may also carrying power across the rows. In this example layout, the power traces 202-208 in the second metal layer M2 carry power across the rows of macro cells and the first metal layer is used for routing signaling and intraconnections 210-214 for transistors in the macro cells. The transistors may be, for example, n-type and p-type, Metal-Oxide-Semiconductor Field-Effect-Transistors.

Figure 2D:
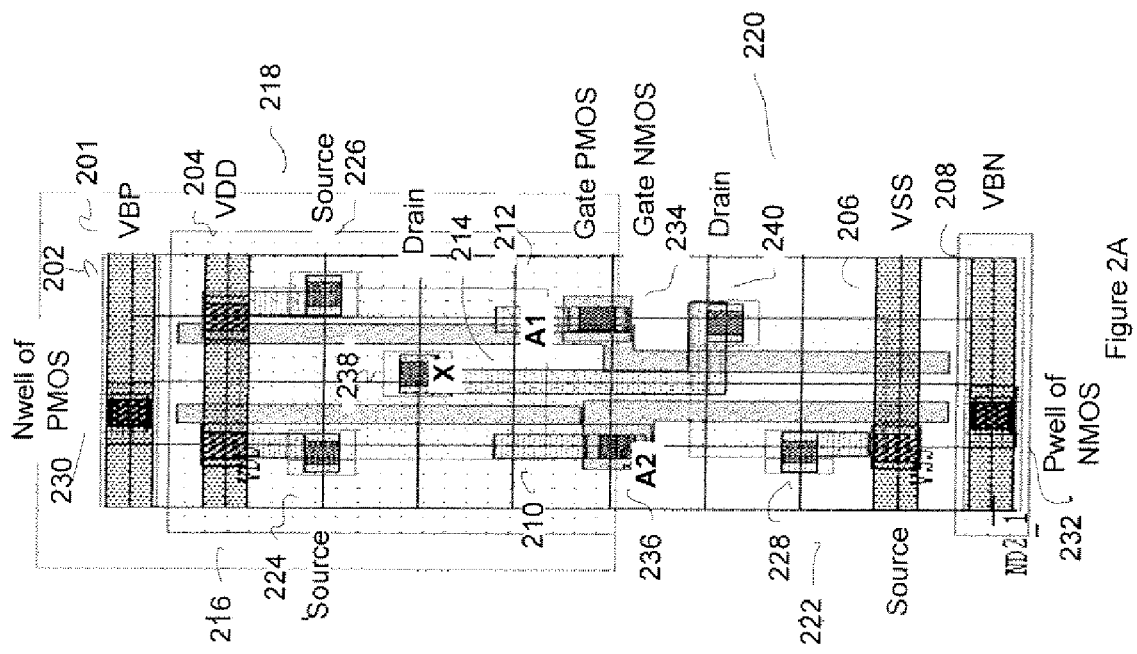
FIG. 2d illustrates a an embodiment of a macro cell implementing a 2 input NAND function and consisting of three power traces, each carrying a different potential of voltage to transistors in the integrated circuit.
Figures 2B, 2C:
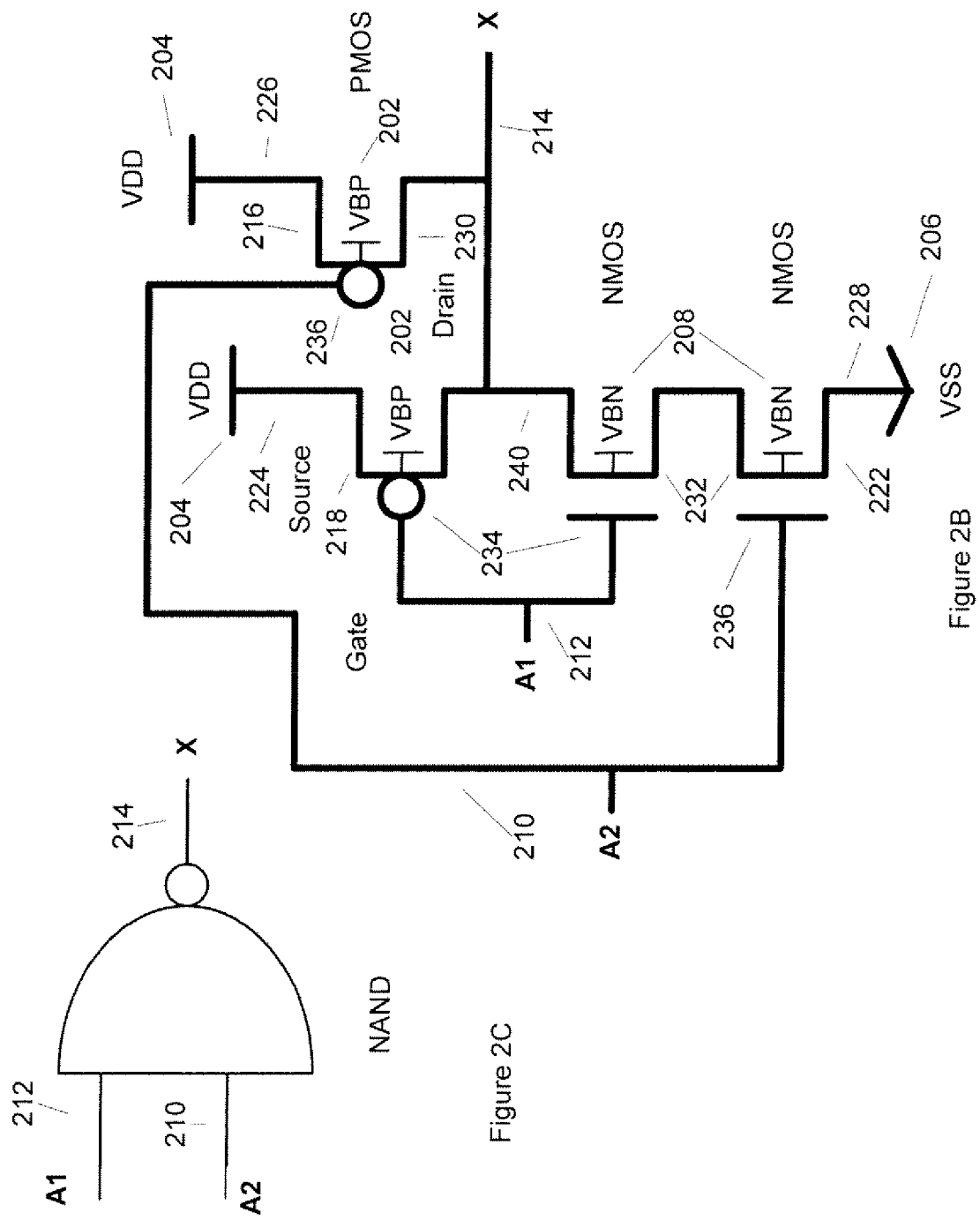

FIG. 2b illustrates an example schematic diagram of an embodiment of the transistors in the macro cell illustrated in FIG. 2a. FIG. 2c illustrates a logic symbol corresponding to the macro cell illustrated in FIG. 2a.

Referring to FIGS. 2a-2c, the macro cell may have set of four transistors within the cell, two n-type NMOS transistors 220, 222 and two p-type PMOS transistors 216, 218. A first power trace 204 in the second metal layer M2 may supply a VDD voltage potential via contacts to the source terminals 224, 226 of the PMOS transistors. A second power trace 206 in the second metal layer M2 may supply a VSS voltage potential via contacts to a source terminal 228 of an NMOS transistor. A third power trace 202 in the second metal layer M2 may supply a third voltage potential, such as VBP, via contacts to a Nwell substrate 230 associated with the PMOS transistors to bias the wells of those transistors. The third voltage potential, VBP, of the third power trace 202 may bias the Nwell substrate 230 higher than the VDD voltage potential on the first power trace 204 to reduce power loss due to leakage. The third voltage potential, VBP, of the third power trace 202 may also bias the Nwell substrate 230 to slightly lower than the VDD voltage potential on the first power trace 204 to enhance the performance switching speed of these transistors.

Similarly, a fourth power trace 208 in the second metal layer M2 may supply a fourth voltage potential, such as VBN, via contacts to a Pwell substrate 232 associated with the NMOS transistors to bias the Pwells of those transistors. The fourth voltage potential, VBN, of the fourth power trace 208 may bias the Pwell substrate 232 lower than the VSS voltage potential on the second power trace 206 to reduce power loss due to leakage. The fourth voltage potential, VBN, of the fourth power trace 208 may also bias the Pwell substrate 232 to slightly higher than the VSS voltage potential on the second power trace to enhance the performance switching speed of these transistors.

Thus, the additional power supplies traces, such as the third power trace 202 and the fourth power trace 208, may route a voltage potential to bias the well substrate 230, 232 of a transistor higher than a source voltage potential on that transistor to reduce power loss due to leakage or in another way alter the biasing of that transistor.

The routing technique allows easier signaling and intraconnection routing with all of the power traces routed in metal layers above the first metal layer. The first signal trace 212 on the first metal layer routed parallel to the columns of macro cells may carry a first input signal (A1) to the gate terminal 234 of one of the NMOS transistors as well as the gate terminal 234 of one of the PMOS transistors. The second signal trace 210 on the first metal layer routed parallel to the columns of macro cells may carry a second input signal (A2) to the gate terminal 236 of the second NMOS transistor as well as the gate terminal 236 of the second of the PMOS transistor. The third signal trace 214 on the first metal layer routed parallel to the columns of macro cells may connect to the drain terminals 238, 240 of the PMOS and NMOS transistors. The third signal trace 214 on the first metal layer may carry the output signal (X) out of this configuration of transistors.

Note, the first macro cell 201 is shown only by way of example. The first macro cell 201 may be advantageously replaced with one or more different macro cells now known, or later developed. Also, although stacked via contacts couple power traces 202-208 with individual macro cells; of course, other methods besides stacked via contacts may be used to make the connections.

The power traces 202-208 may be routed horizontal to the orientation of the macro cell 201 and with a specific relationship to the boundaries of that macro cell. The third power trace 202 carrying VBP may be routed over a first edge of a cell boundary of the first macro cell 201 to share the third power trace 202 with an adjacent cell. The second power trace 206 carrying VSS may be routed along an interior of the cell boundary. Likewise, the first power trace 202 carrying VDD may be routed along the interior of the cell boundary. The fourth power trace 208 carrying the VBN voltage potential may be routed at an opposite edge of the cell boundary. Therefore, the fourth power trace 208 may also be shared with another adjacent cell. Thus, the architectural layout of power trace lines at the edges of adjacent rows of macro cells shifted laterally with respect to each other allows sharing of power supply traces.

In this example, the power traces for the VBP/VBN voltage supplies are at the top/bottom edges of the logic cell. The power traces for VDD/VSS are routed over the logic cell. However, VDD/VSS may rout on the edges and VBN/VBP may be routed on the interior of the macro cell. The routing of the power traces in relation to the cell boundary may be varied to maximize the density of macro cells in the integrated circuit.

The power traces 202-208 may be routed in metal layers that extend across the integrated circuit predominantly in a direction parallel i.e. horizontal to the rows of macro cells. The metal layers above the first metal layer M1, in this example solely M2, may route four or more different voltage supplies to the transistors in that macro cell. The parallel routing technique in combination with the varied edge and interior routing allows the power supply source connections to VDD/VSS to be easily completed with no additional cell area consumed by the supply wire for this connection.

FIG. 2d illustrates a block diagram an embodiment of a plurality of three power traces, each carrying a different potential of voltage to transistors in a macro cell of an integrated circuit. Except as noted, the second macro cell is connected to the power traces in the metal layers similar to the first macro cell illustrated in FIG. 2a. The first power trace 204d supplies a VDD voltage potential via contacts to the source terminals of the PMOS transistors. The second power trace 206d supplies a VSS voltage potential via contacts to a source terminal 222d of an NMOS transistor. The second power trace 206d also supplies a VSS voltage potential via contacts to a Pwell substrate 232d associated with the NMOS transistor to bias the well of that transistor. The third power trace 202d in the second metal layer M2 may supply a third voltage potential, such as VBP, via contacts to a Nwell substrate 230d associated with the PMOS transistors to bias the wells of those transistors. Thus, the Pwell substrate 232d of the NMOS transistor will be the same potential voltage potential as the source terminal 222d. However, the Nwell substrate 230d of the PMOS transistors may be biased to a different voltage potential then the source terminals 224d and 226d.

The third power trace 202d being discretely separate from the primary power supply connections can provide for a wide variety of different functions. For example, the first power trace 204d may carry a VDD voltage potential that can be turned on and off when in operation to the second macro cell 201d while the third power trace 202d provides a constant supply of power to particular components within the macro cell during modes of operation such as a sleep mode. When VDD is turned off during a sleep mode, the second power trace can still provide a voltage potential to the well of the transistors to maintain a logic state stored by that macro cell. Also, the third power trace 202d can carry a voltage potential that can be continuously supplied in all operations to the second macro cell 201d. The third power trace 202d may provide a switchable on/off source of power to components in the macro cell when the integrated circuit is in operation. The different voltage potentials carried by the third power trace 202d can bias the transistors to enhance their performance or reduce leakage.

The routing of multiple voltage potentials and the capability to vary the power trace's specific relationship to the boundaries of macro cell in row of macro cells allows macro cells having different voltage potential requirements and different amounts of voltage supplies to be located adjacent and intermingled with one another. Each macro cell connecting only to the power traces carrying the voltage potentials needed for that macro cell.

The second macro cell 201d has a smaller height than the first macro cell 201. Thus, the routing of three or more power traces across the integrated circuit allows the use of rows of macro cells with various heights. Note, the second macro cell 201d could easily have a smaller height than the first macro cell 201 but the same number of power rails, such as four, connected to the second macro cell 201d.

The first metal layer may be routed predominantly horizontal with respect to row of macro cells, or predominantly vertical with respect to row of macro cells, or have no predominant direction at all. The second metal layer routing the power rails may be predominantly horizontal with respect to row of macro cells.

Figures 3A, 3B, 3C:
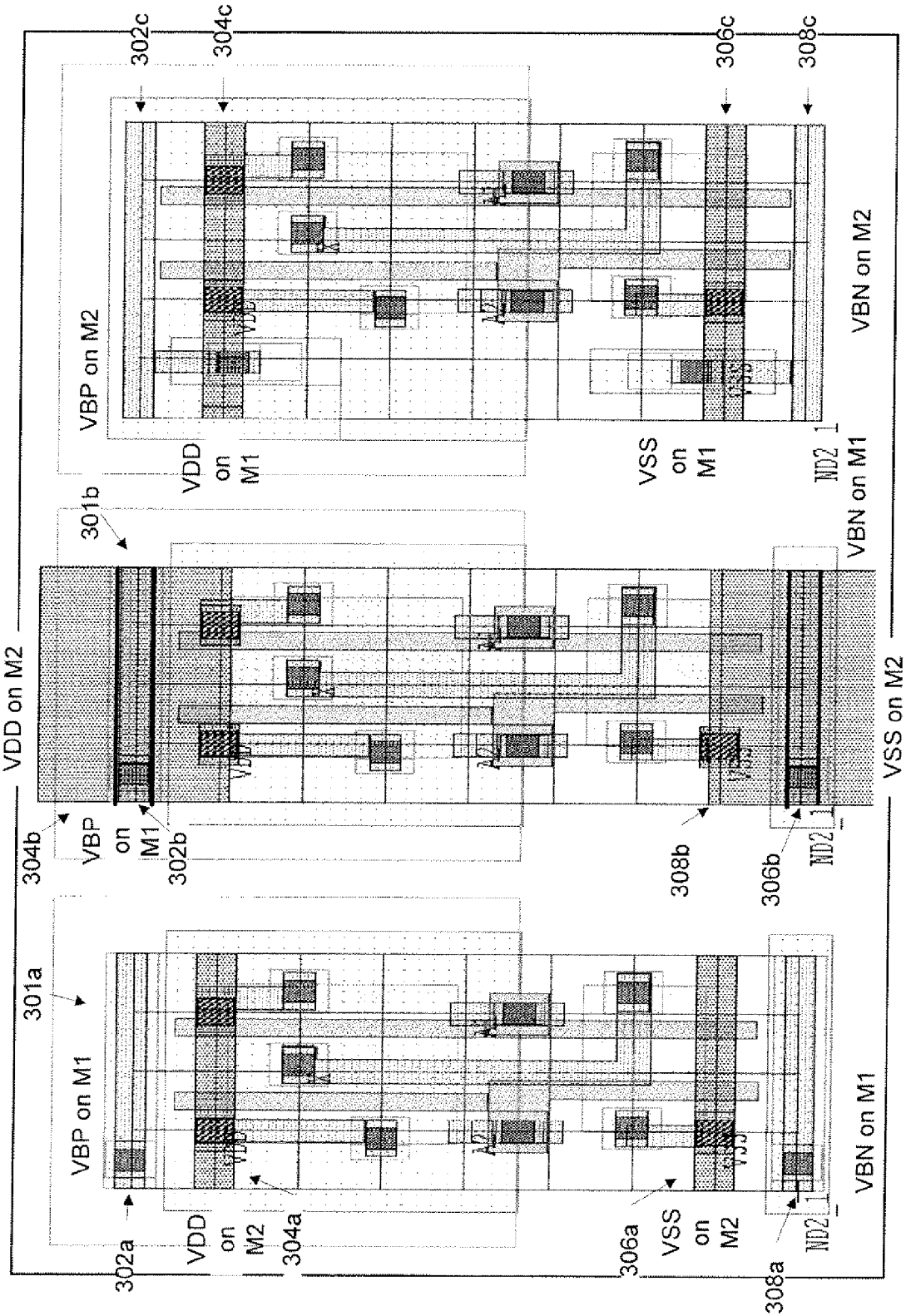
FIGS. 3a-3c and FIG. 4 illustrate other embodiments of power traces having different widths and routed on multiple metal layers to transistors in a 2 input NAND cell of an integrated circuit.

FIGS. 3a-3c illustrate a block diagram an embodiment of power traces having different widths and routed on multiple metal layers to transistors in a macro cell of an integrated circuit. FIGS. 3a-3c illustrate three example options for routing source voltage supplies (VDD/VSS) and substrate/Nwell voltage supplies (VBNNBP) using the Metal1 and Metal2 conductive layers. Referring to FIG. 3a, the first power trace 302a is routed on the first metal layer and supplies a VBP voltage potential to the third macro cell 301a. The second power trace 304a is routed on the second metal layer and supplies a VDD voltage potential to the third macro cell 301a. The third power trace 306a is also routed on the second metal layer and supplies a VSS voltage potential to the third macro cell 301a. The fourth power trace 308a is routed on the first metal layer and supplies a VBN voltage potential to the third macro cell 301a.

Referring to FIG. 3b, the routing connections are the same as described in FIG. 3a. However, the width of the second power trace 304b and third power trace 306b is much wider. The width of the second power trace 304b on the second metal layer extends over and past the first power trace 302b on the first metal layer. A macro cell adjacent to the third macro cell 301 b may share the VDD potential on the wide second power trace 304b even though components on the interior portion of the third macro cell 301 b are connecting to that power trace.

Referring to FIG. 3c, the routing connections are similar as described in FIG. 3a. However, the metal layer routings have been reversed. The first power trace 302c is routed on the second metal layer. The second power trace 304c is routed on the first metal layer. The third power trace 306c is routed on the first metal layer. Finally, the fourth power trace 308c is routed on the second metal layer. Note, any of these power traces may also be routed on the third metal layer or even higher.

Another advantage of forming power supply traces on both the first layer of metal and second layer of metal is that it frees up some of the first level of metal for routing of local interconnections as well as allows power supply traces carrying a different voltage potential to be routed on a different metal layer.

The power rails routed in the first metal layer may be routed predominantly horizontal with respect to the rows of macro cells. The power rails routed in the second metal layer may also be routed predominantly horizontal with respect to the rows of macro cells.

Figure 4:
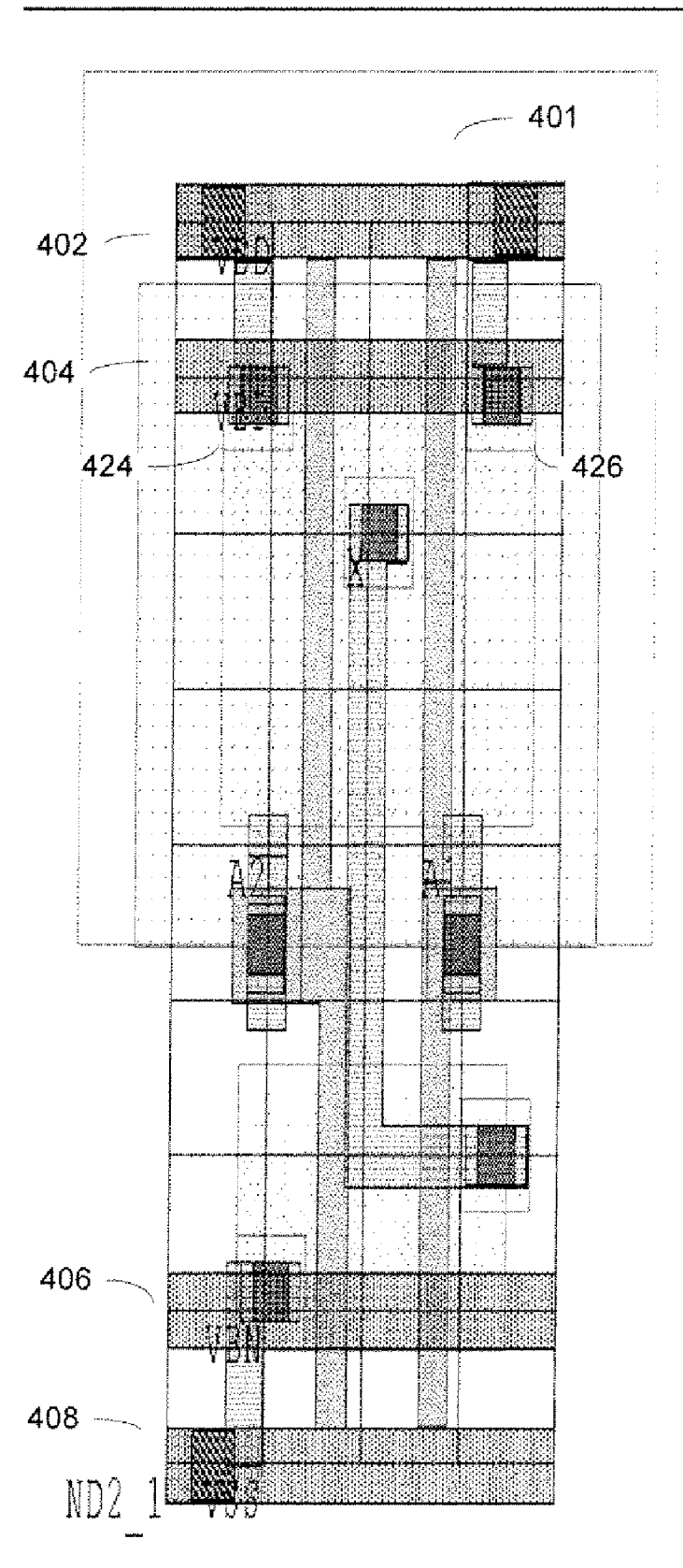

FIG. 4 illustrates a block diagram an embodiment of routing the primary voltage supply traces at the edges of a cell boundary. Power supply traces 402, 408 that carry VDD/VSS respectively are routed at the top/bottom of the macro cell 401 respectively. Power supply traces 404, 406 that carry the Nwell and substrate voltage potential are routed over the interior of the macro cell 401. This demonstrates the flexibility of the design as well as a feature that may not be achievable with conventional routing technology. In this configuration, using a conventional approach it might not be possible to route the source/drain connections to the VDD/VSS supply without breaking the VBN and VBP traces. The second power trace 402 routs on, for example, a metal layer above the first metal layer and routes directly over the source terminals 424 426 of the fourth macro cell 401. Yet, the first power trace 402 routs on, for example, the first metal layer and supplies a VDD voltage potential to the source terminals 424 426 without having to worry about routing around the second power trace 404c being directly over those components.

The routing technique of multiple power traces in multiple metal layers or even a single metal layer above the initial metal layer is also compatible with conventional NXT routing style cell libraries. The second conducting layer (typically M2) may be routed parallel to the cell rows. Further, each successive conductive layer above the second conductive layer is routed orthogonal to the conductive layer below that conductive layer.

Multiple voltage supplies can be provided on second conducting layer alone, or in combination with the first conducting layer. One or more voltage supplies in addition to the primary supply, typically VDD/VSS (or Ground) for CMOS, are possible. The supply potentials routed on the second conducting layer or above can be easily accessed from the first conducting layer within the cell. Several supply architectures tuned to specific applications are possible.

Thus, the routing technique of multiple power traces in multiple metal layers or even a single metal layer above the initial metal layer provides improved flexibility for designing cell-based integrated circuits, such as standard cells and gate-arrays, that require multiple supplies of different voltage potential for cells in the same vicinity. Further, the routing technique eliminates any requirement that cells requiring unique or multiple supplies at different voltage potential be grouped with like cells. The routing technique allows locally intermingled placement of cells that require common voltage supplies or non-common voltage supply potentials. The routing technique provides multiple supply connections of different voltage potential to be made available without a substantial increase in circuit area. The routing technique provides additional functionality without appreciably increasing area. The routing technique does not restrict the location of the interconnect(s) providing the substrate voltage potential or the location of the interconnect(s) providing the device source voltage potentials.

This routing technique provides an opportunity to reduce power consumption due to leakage or increase the performance of all or some portion of circuits in a design. The library/platform solution allows a chip designer the option of supplying separate N-well or substrate bias to the circuits on a chip without substantially effecting area.

Figure 5:
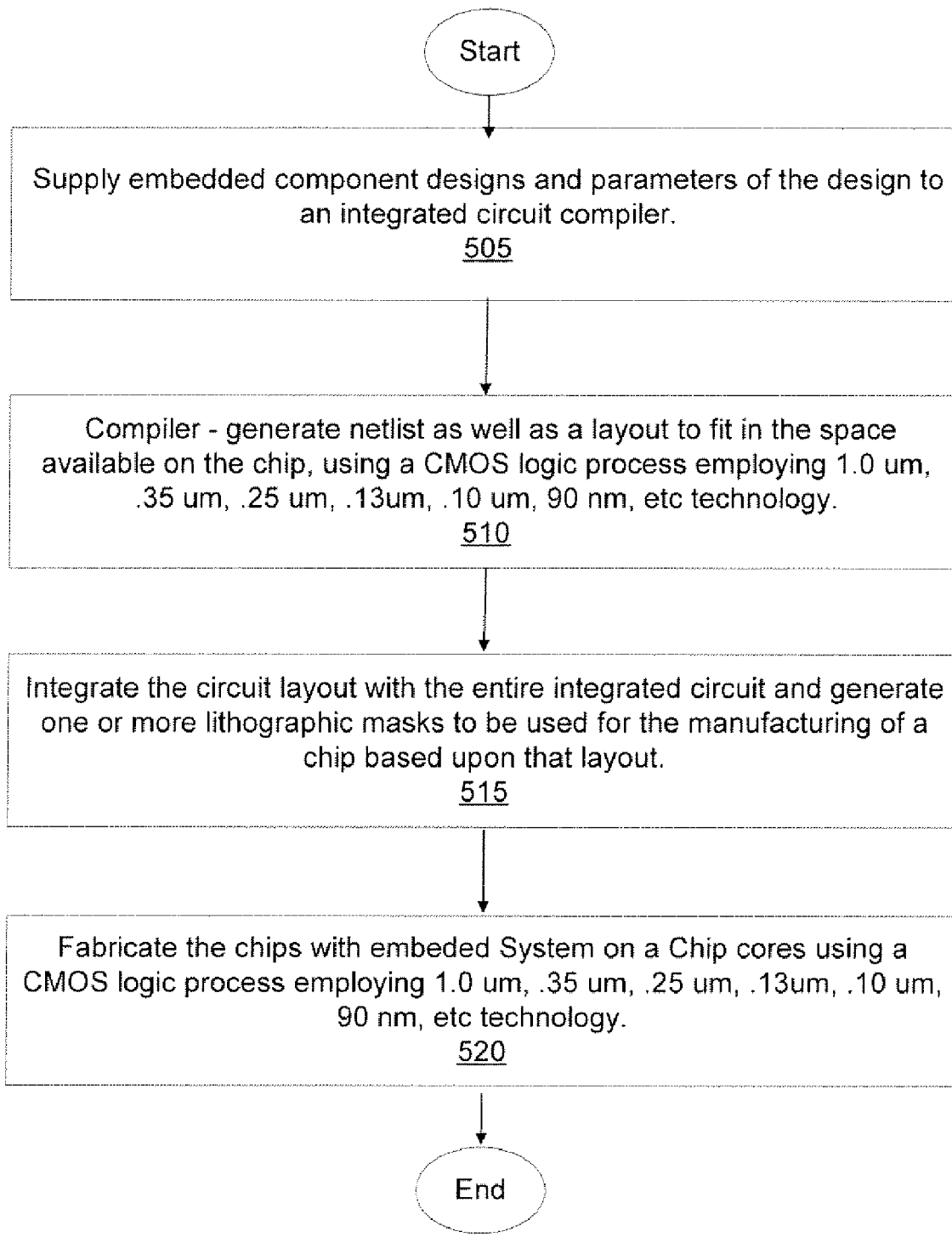
FIG. 5 illustrates an example process of generating an integrated circuit with multiple power traces routed to one or more of the basic cells in a cell-based integrated circuit from designs of components with an embodiment of a compiler.

FIG. 5 illustrates an example process of generating an integrated circuit with multiple power traces routed to one or more of the macro cells in a cell-based integrated circuit from designs of components with an embodiment of a compiler. The compiler may be used for making low power memory and logic platforms, high-density, high-speed and ultra-low-power logic standard cells, metal routing, as well as other applications.

In block 505, the designs for each processor and memory component for the embedded circuit are supplied to the compiler, as well as other design parameters such as the number of columns and number of rows of the array, the available size on the chip, the number of metal layers, and other parameters. Thus, the designs for a low power memory design may be supplied to the compiler. A compiler may be a software program comprised of multiple algorithms and designs for the purpose of generating a circuit design and a layout in a space available on a target chip. The set of application-specific algorithms and interfaces of the compiler may be used by system IC integrators to rapidly create hundreds of silicon-proven System On a Chip cores. The compiler receives the component designs and utilizes those component designs in conjunction with circuit designs to optimize a circuit design and layout in the space available on a target chip.

In block 510, the compiler generates a netlist and a layout targeted to fit in the space available on a target chip. The compiler stores the data representing the embedded circuit typically on a machine-readable medium. The compiler selects the component building blocks so that they are sized appropriate for the targeted fabrication technology. The compiler then provides the circuit layout to be used to generate one or more lithographic masks to be used in the fabrication of that embedded circuit such as a memory. The compiler also provides a netlist for verification of the embedded circuit.

In block 515, the circuit layout generated is integrated with the rest of the layout for the chip and a machine generates the lithographic masks that contain the information necessary for the fabrication of a functional device. The machine generates one or more lithographic masks to be used to transfer that circuit design onto the chip.

In block 520, a fabrication facility fabricates the chips with the embedded circuits using the lithographic masks generated from the compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded circuit onto the chip itself. In an embodiment, the low power memory design compiler is designed for embedded applications in a standard CMOS logic process.

In block 525, the chip may be programmed in the back end of the fabrication process using a layer physically higher than the diffusion layer. The Compiler may generate instances that may be programmed by a ROM programming tool. The Compiler uses routing and cell architecture that allows designers to create custom designs with just a few metal layers and via masks. The via layer and/or metal layer programmed cells may be completed in the back-end of the manufacturing process. If the programming of a ROM memory isn't made until later or a revision is needed, then the designer merely has to redesign the block, a few metal layers and via masks, thereby preserving all of the other masks.

In one embodiment, the software used to facilitate the compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, EPROMs, EEPROMs, FLASH, magnetic or optical cards, or any type of media suitable for storing electronic instructions. Slower mediums could be cached to a faster, more practical, medium.

In an embodiment, an example compiler may comprise the following. A graphic user interface, a common set of processing elements, and a library of files containing design elements such as circuits, control logic, and cell arrays that define the complier. In an embodiment, object code in a set of executable software programs.

In an embodiment, a designer chooses the specifics of a memory configuration to produce a set of files defining the requested memory instances. A memory instance may include front end views and back end files. The front end views support documentation, simulation, debugging, and testing. The back end files, such as a layout, physical LEF, etc are for layout and fabrication.

The complier outputs may include Behavioral Models and Test Benches (Verilog, VHDL), ·Timing Models (TLF, Lib and STAMP), Test Models (MemBIST, FastScan), Structural Netlists (EDIF, Spice), Power Models (WattWatcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal layers and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Although there may be some short departures from the direction of traces on each of the metal layers, the general trend is in the directions described. Departures from the general layout scheme as described may be made for solving ad hoc routing problems.

While some specific embodiments of the invention have been shown the invention is not to be limited to these embodi-

We claim:

1. A method of designing an integrated circuit comprising:
routing, at a computing device, a first power trace in a second metal layer located above a first metal layer,
routing a first power trace in a second metal layer located above a first metal layer, the first power trace carrying a first voltage potential to a row of cells in the integrated circuit, the first voltage potential turned on or off during operation of the integrated circuit;
routing a second power trace in the second metal layer for carrying a second voltage potential to the row of cells in the integrated circuit, the second voltage potential remaining turned on during the operation of the integrated circuit; and
routing a third power trace in the second metal layer for providing a ground potential to the row of cells during the operation of the integrated circuit.

2. The method of claim 1,
wherein the second metal layer is routed in a horizontal direction.

3. The method of claim 1, further comprising:
routing at least one signal trace in a third metal layer above the second metal layer, the third metal layer orientated orthogonal to the second metal layer.

4. The method of claim 1, further comprising:
routing the first power trace along a first edge of a cell boundary of the first macro cell to share the first power trace with a cell in an adjacent row of cells;
routing the third power trace along a second edge of the cell boundary opposite to the first edge to share the third power trace with another cell in another adjacent row of cells; and
routing the second power trace along an interior of the cell between the first and second edges of the cell boundary.

5. The method of claim 1, further comprising:
connecting the second power trace to one or more well substrates.

6. An apparatus generated through a method comprising:
routing a first power trace in a second metal layer located above a first metal layer, the first power trace carrying a first voltage potential to a row of cells in an integrated circuit, the first voltage potential turned on or off during operation of the integrated circuit;
routing a second power trace in the second metal layer for carrying a second voltage potential to the row of cells in the integrated circuit, the second voltage potential remaining turned on during the operation of the integrated circuit; and
routing a third power trace in the second metal layer for providing a ground potential to the row of cells during the operation of the integrated circuit.

7. A non-transitory machine-readable medium that stores instructions, which when executed by a machine, to cause the machine to perform operations comprising:
routing a first power trace in a first metal layer to each cell in a row of cells of an integrated circuit, the first power trace carrying a first voltage potential that is turned on or off during operation of the integrated circuit;
routing a second power trace in a second metal layer located above the first metal layer to each cell in the row of cells, the second power trace carrying a second voltage potential that remains turned on during the operation of the integrated circuit; and
routing a third power trace in the second metal layer carrying a ground voltage potential to each cell in the row of cells during the operation of the integrated circuit.

8. The machine-readable medium that stores instructions of claim 7, wherein the third metal layer is orientated orthogonal to the second metal layer.

9. The machine-readable medium that stores instructions of claim 7, which executes further instructions to cause the machine to perform the further operations comprising:
routing the second power trace along a first edge of a cell boundary of the first macro cell to share the second power trace with a cell in an adjacent row of cells;
routing the third power trace along a second edge of the cell boundary opposite to the first edge to share the third power trace with another cell in another adjacent row of cells;
routing the first power trace along an interior of the cell between the first and second edges of the cell boundary; and
routing a fourth power trace to connect to one or more well substrates associated with the row of cells.

10. The machine-readable medium of claim 7, wherein the machine-readable medium further comprises instructions to provide a layout utilized to generate one or more lithographic masks used in the fabrication of the integrated circuit.

11. An apparatus generated through the operations caused by a non transitory machine-readable medium that stores instructions to:
route a first power trace in a first metal layer to each cell in a row of cells of an integrated circuit, the first power trace carrying a first voltage potential that is turned on or off during operation of the integrated circuit;
route a second power trace in a second metal layer located above the first metal layer to each cell in the row of cells, the second power trace carrying a second voltage potential that remains turned on during the operation of the integrated circuit; and
route a third power trace in the second metal layer carrying a ground voltage potential to each cell in the row of cells during the operation of the integrated circuit.

12. The apparatus of claim 11, wherein the third metal layer is orientated orthogonal to the second metal layer.

13. The apparatus of claim 11, wherein the machine-readable medium further stores instructions to:
route the second power trace along a first edge of a cell boundary of the first macro cell to share the second power trace with a cell in an adjacent row of cells;
route the third power trace along a second edge of the cell boundary opposite to the first edge to share the third power trace with another cell in another adjacent row of cells;
route the first power trace along an interior of the cell between the first and second edges of the cell boundary; and
route a fourth power trace to connect to one or more well substrates associated with the row of cells.

14. The apparatus of claim 13, wherein the machine-readable medium further stores instructions to provide a layout utilized to generate one or more lithographic masks used in the fabrication of the integrated circuit.

15. A method of designing an integrated circuit, comprising:
at a computing device, routing a first power trace in a first metal layer to a row of cells in the integrated circuit, the first power trace carrying a first voltage potential that is turned on or off during operation of the integrated circuit;

routing a second power trace in a second metal layer located above the first metal layer to the row of cells, the second power trace carrying a second voltage potential during the operation of the integrated circuit; and routing a third power trace in the second metal layer carrying a ground voltage potential during the operation of the integrated circuit.

16. The method of claim 15, further comprising:

routing the second power trace along a first edge of a cell boundary of the first macro cell to share the second power trace with a cell in an adjacent row of cells;

routing the third power trace along a second edge of the cell boundary opposite to the first edge to share the third power trace with another cell in another adjacent row of cells;

routing the first power trace along an interior of the cell between the first and second edges of the cell boundary; and routing a fourth power trace to connect to one or more well substrates associated with the row of cells.

17. The method of claim 15, wherein the third metal layer is orientated orthogonal to the second metal layer.

18. An apparatus generated through a method comprising:

routing a first power trace in a first metal layer to a row of cells in an integrated circuit, the first power trace carrying a first voltage potential that is turned on or off during operation of the integrated circuit;

routing a second power trace in a second metal layer located above the first metal layer to the row of cells, the second power trace carrying a second voltage potential during the operation of the integrated circuit; and routing a third power trace in the second metal layer carrying a ground voltage potential during the operation of the integrated circuit.

19. The apparatus of claim 18, wherein the third metal layer is orientated orthogonal to the second metal layer.

20. The apparatus of claim 18, wherein the method further comprises:

routing the second power trace along a first edge of a cell boundary of the first macro cell to share the second power trace with a cell in an adjacent row of cells;

routing the third power trace along a second edge of the cell boundary opposite to the first edge to share the third power trace with another cell in another adjacent row of cells;

routing the first power trace along an interior of the cell between the first and second edges of the cell boundary; and routing a fourth power trace to connect to one or more well substrates associated with the row of cells.

* * * * *

UNITED STATES PATENT AND TRADEMARK OFFICE
CERTIFICATE OF CORRECTION

PATENT NO. : 8,132,142 B2
APPLICATION NO. : 11/734202
DATED : March 6, 2012
INVENTOR(S) : Sherlekar et al.

It is certified that error appears in the above-identified patent and that said Letters Patent is hereby corrected as shown below:

On title page, item (75)

In the inventor information on the coversheet of the patent, replace "Gene Sluss, Cupertino, CA (US)" with -- Gene Sluss, Pleasanton, CA (US) --.

In column 11, line 6, between "integrated circuit" and "comprising," insert -- in a computing device, --.

In column 11, lines 7-9, delete "a first power trace in a second metal layer located above a first metal layer, routing".

Signed and Sealed this
Twenty-ninth Day of May, 2012

David J. Kappos
*Director of the United States Patent and Trademark Office*